United States Patent
Wu et al.

(10) Patent No.: US 8,643,614 B2
(45) Date of Patent: *Feb. 4, 2014

(54) TOUCH-SENSITIVE DEVICE AND TOUCH-SENSITIVE DISPLAY DEVICE

(75) Inventors: Ming-Kung Wu, Tai Chung (TW);
Kuo-Chang Su, Tai Nan (TW);
Chia-Chi Chen, Tai Chung (TW);
Yu-Ting Lin, Tai Chung (TW)

(73) Assignee: Wintek Corporation, Taichung (TW)

( * ) Notice: Subject to any disclaimer, the term of this patent is extended or adjusted under 35 U.S.C. 154(b) by 260 days.

This patent is subject to a terminal disclaimer.

(21) Appl. No.: 13/152,805

(22) Filed: Jun. 3, 2011

(65) Prior Publication Data
US 2011/0298739 A1    Dec. 8, 2011

(30) Foreign Application Priority Data
Jun. 7, 2010   (TW) .............................. 099118308 A (51) Int. Cl.
*G06F 3/041* (2006.01)
(52) U.S. Cl.
USPC ............................ 345/173; 345/174; 345/176
(58) Field of Classification Search
USPC ...................... 345/173–179; 178/18.01–20.04
See application file for complete search history.

(56) References Cited

U.S. PATENT DOCUMENTS

| | | | |
|---|---|---|---|
| 7,825,998 B2 * | 11/2010 | Chen et al. | 349/12 |
| 8,378,983 B2 * | 2/2013 | Nozawa et al. | 345/173 |
| 2009/0102814 A1 | 4/2009 | Lin et al. | |
| 2009/0160817 A1 | 6/2009 | Wu et al. | |
| 2009/0194344 A1 * | 8/2009 | Harley et al. | 178/18.06 |
| 2009/0207151 A1 | 8/2009 | Liu et al. | |
| 2009/0284487 A1 * | 11/2009 | Nakanishi et al. | 345/173 |
| 2010/0013786 A1 * | 1/2010 | Nishikawa et al. | 345/173 |
| 2010/0026656 A1 | 2/2010 | Hotelling et al. | |
| 2010/0164881 A1 * | 7/2010 | Kuo et al. | 345/173 |
| 2010/0231554 A1 * | 9/2010 | Anno et al. | 345/174 |

FOREIGN PATENT DOCUMENTS

TW    M344544    11/2008

OTHER PUBLICATIONS

Office Action dated Apr. 24, 2013 from U.S. Appl. No. 13/750,369.
Office Action dated Sep. 23, 2013 from U.S. Appl. No. 13/750,369.

* cited by examiner

*Primary Examiner* — Vijay Shankar
*Assistant Examiner* — Sanjiv D Patel
(74) *Attorney, Agent, or Firm* — Muncy, Geissler, Olds & Lowe, PLLC (57) ABSTRACT

A touch-sensitive device includes a transparent substrate, a touch-sensing structure, a decorative layer, a trace layer, a passivation layer and a sheltering layer. The touch-sensing structure is disposed on the transparent substrate and located in a touch-sensitive region. The decorative layer is disposed on the transparent substrate and located in a non-touch-sensitive region, and the trace layer is disposed on the decorative layer. The passivation layer is disposed on the transparent substrate and at least covers the touch-sensing structure and the trace layer. The sheltering layer is disposed at least on the passivation layer and located in the non-touch-sensitive region.

48 Claims, 6 Drawing Sheets

TOUCH-SENSITIVE DEVICE AND TOUCH-SENSITIVE DISPLAY DEVICE

BACKGROUND OF THE INVENTION a. Field of the Invention

The invention relates to touch-sensitive device and a touch-sensitive display device having high reliability and low light leakage.

b. Description of the Related Art

Figure 6:
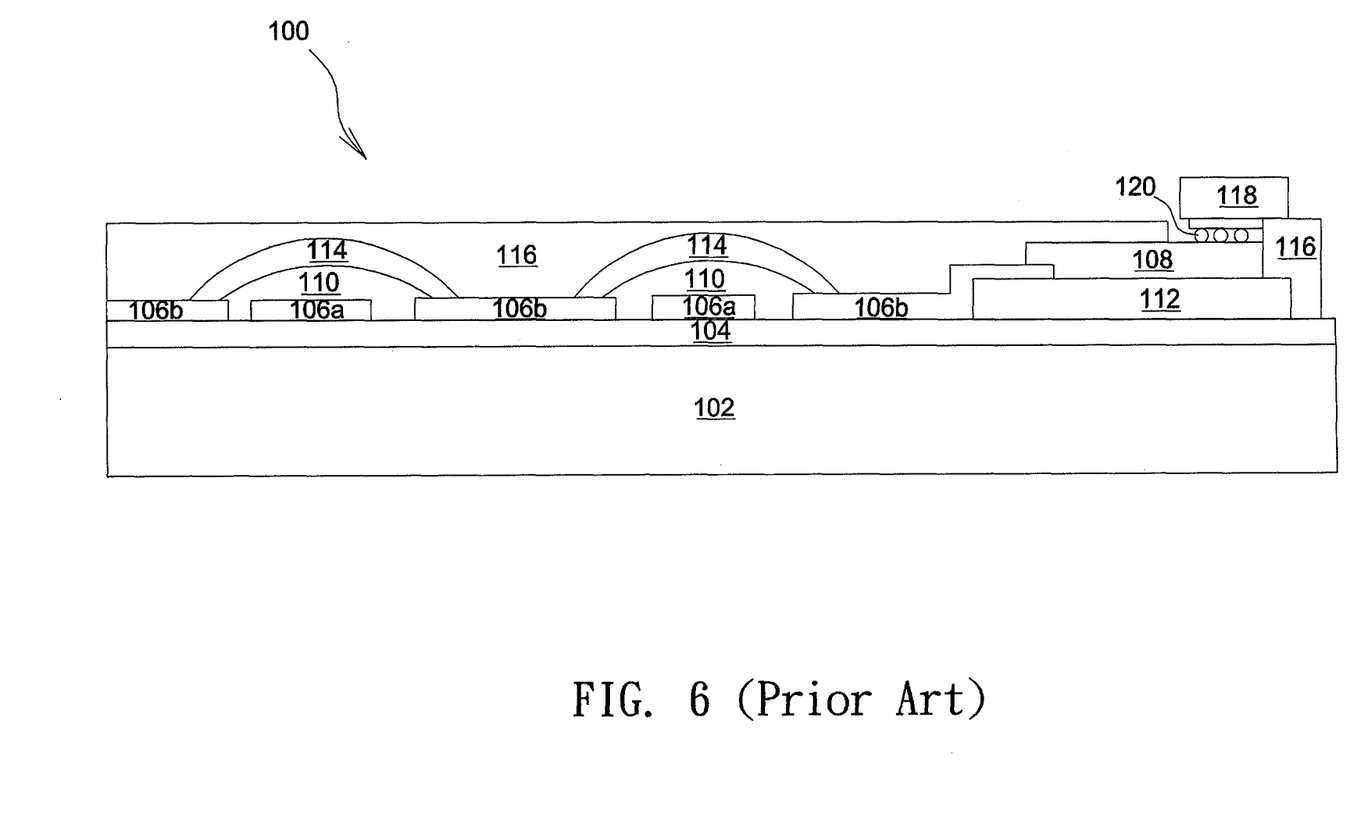
FIG. 6 shows a cross-sectional schematic diagram of a conventional touch-sensitive device.

Referring to FIG. 6, a conventional touch-sensitive device 100 has a glass substrate 102, a silicide layer 104 formed on the glass substrate 102, a plurality of touch-sensing electrodes (such as X-axis electrodes 106a and Y-axis electrodes 106b), a trace layer 108, an organic dielectric layer 110 and a decorative layer 112. The X-axis electrodes 106a and the Y-axis electrodes 106b may be arranged in two directions perpendicular to each other. The X-axis electrodes 106a and the Y-axis electrodes 106b are insulated from each other by the organic dielectric layer 110, and, as shown in FIG. 6, two adjacent Y-axis electrodes 106b are connected with each other by a conductive pad 114. The trace layer 108 includes a plurality of metal traces, and the silicide layer 116 covers the X-axis electrodes 106a, the Y-axis electrodes 106b and the trace layer 108 entirely to function as a passivation layer.

According to the above design, in case the periphery of a cover glass wiring structure (such as a traces-on-lens wiring structure shown in FIG. 6) is not given any protection, the production reliability is considerably reduced and the cover glass wiring structure is liable to suffer scrapes. Besides, a commercial cover glass is designed to have various shapes formed by special-shaped edging processing. However, the special-shaped edging processing may cause severe periphery light leakage.

BRIEF SUMMARY OF THE INVENTION

The invention provides a touch-sensitive device and a touch-sensitive display device having high reliability and low light leakage.

In order to achieve one or a portion of or all of the objects or other objects, one embodiment of the invention provides a touch-sensitive device having a touch-sensitive region and a non-touch-sensitive region and including a transparent substrate, a touch-sensing structure, a decorative layer, a trace layer, a passivation layer and a sheltering layer. The touch-sensing structure is disposed on the transparent substrate and located in the touch-sensitive region. The decorative layer is disposed on the transparent substrate and located in the non-touch-sensitive region, and the trace layer is disposed on the decorative layer. The passivation layer is disposed on the transparent substrate and at least covers the touch-sensing structure and the trace layer. The sheltering layer is disposed at least on the passivation layer and located in the non-touch-sensitive region.

In one embodiment, the non-touch-sensitive region is formed on the periphery of the touch-sensitive device, and the sheltering layer is disposed on the periphery of the non-touch-sensitive region.

In one embodiment, a gap region is formed between an outer edge of the decorative layer and a side edge of the transparent substrate, and the sheltering layer overlaps the gap region. In one embodiment, the touch-sensing structure comprises a plurality of first sensing series and a plurality of second sensing series spaced apart from the first sensing series.

In one embodiment, the sheltering layer includes at least one of photo resist, diamond-like carbon, ceramic, colored ink and resin.

In one embodiment, the sheltering layer includes a translucent material, an opaque material, a material having low light transmittance, or a material capable of transmitting infrared light.

In one embodiment, the sheltering layer surrounds the decorative layer.

In one embodiment, each of the passivation layer and the sheltering layer has an opening on the trace layer to expose a part of the trace layer.

In one embodiment, the touch-sensitive device further includes a transparent conductive layer disposed on the decorative layer and electrically connected to the trace layer and an external circuit.

In one embodiment, the touch-sensitive device further includes an insulation layer disposed on the passivation layer and distributed only in the non-touch-sensitive region, and the thickness of the insulation layer is 3-100 times greater than the passivation layer.

In one embodiment, the touch-sensing structure is an underground electrode structure or a bridge electrode structure.

Another embodiment of the invention provides a touch-sensitive display device, where a display device is attached to the aforesaid touch-sensitive device through an optical adhesive.

According to the above embodiments, since the sheltering layer overlaps the gap region between an outer edge of the decorative layer and a side edge of the transparent substrate, the problem of periphery light leakage is avoided. Besides, the sheltering layer is disposed on the periphery of the touch-sensitive device to surround the decorative layer on the trace layer to provide periphery protection of the wiring structure on the cover glass and to avoid side scrapes on the decorative layer to improve production reliability.

Other objectives, features and advantages of the invention will be further understood from the further technological features disclosed by the embodiments of the invention wherein there are shown and described preferred embodiments of this invention, simply by way of illustration of modes best suited to carry out the invention.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
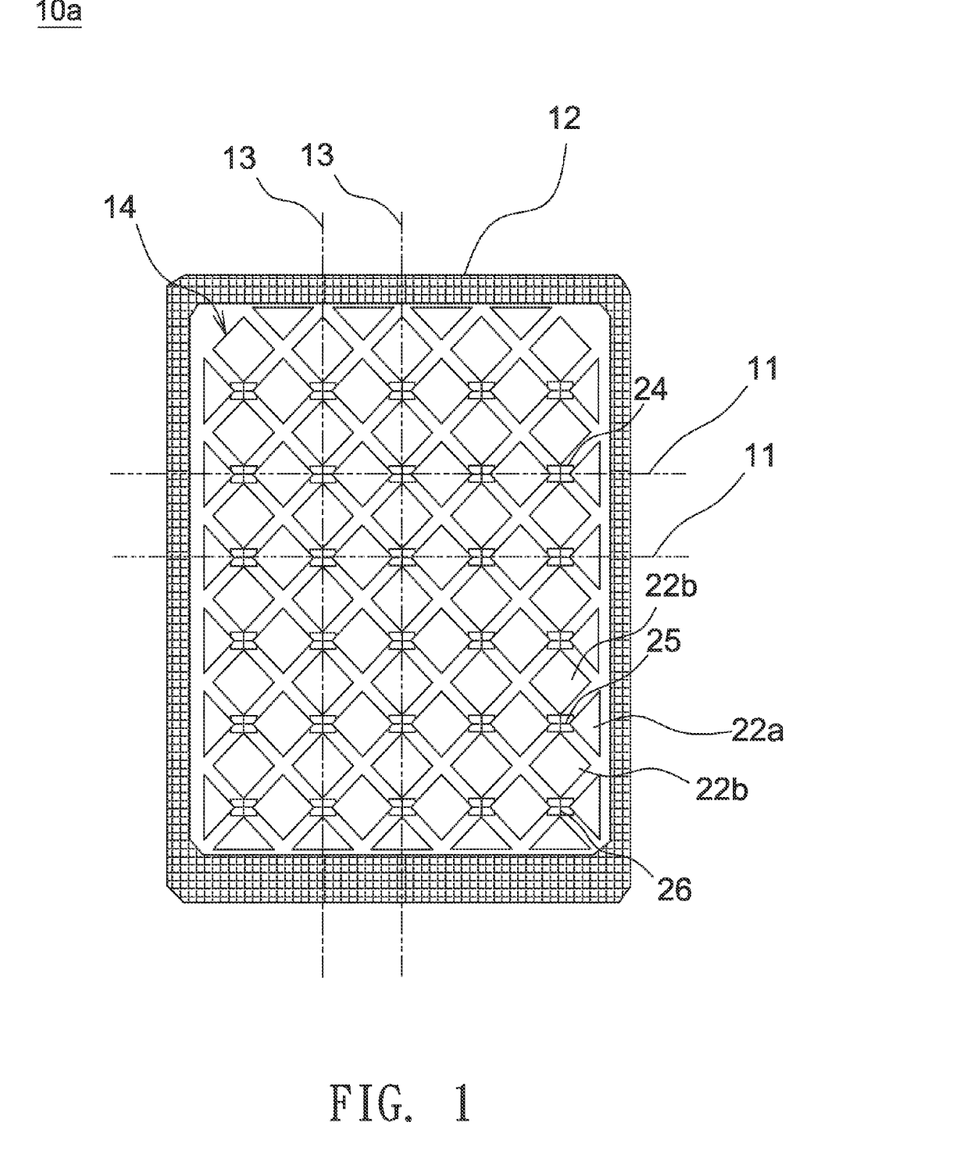
FIG. 1 shows a plan view of a touch-sensitive device according to an embodiment of the invention.
Figure 2:
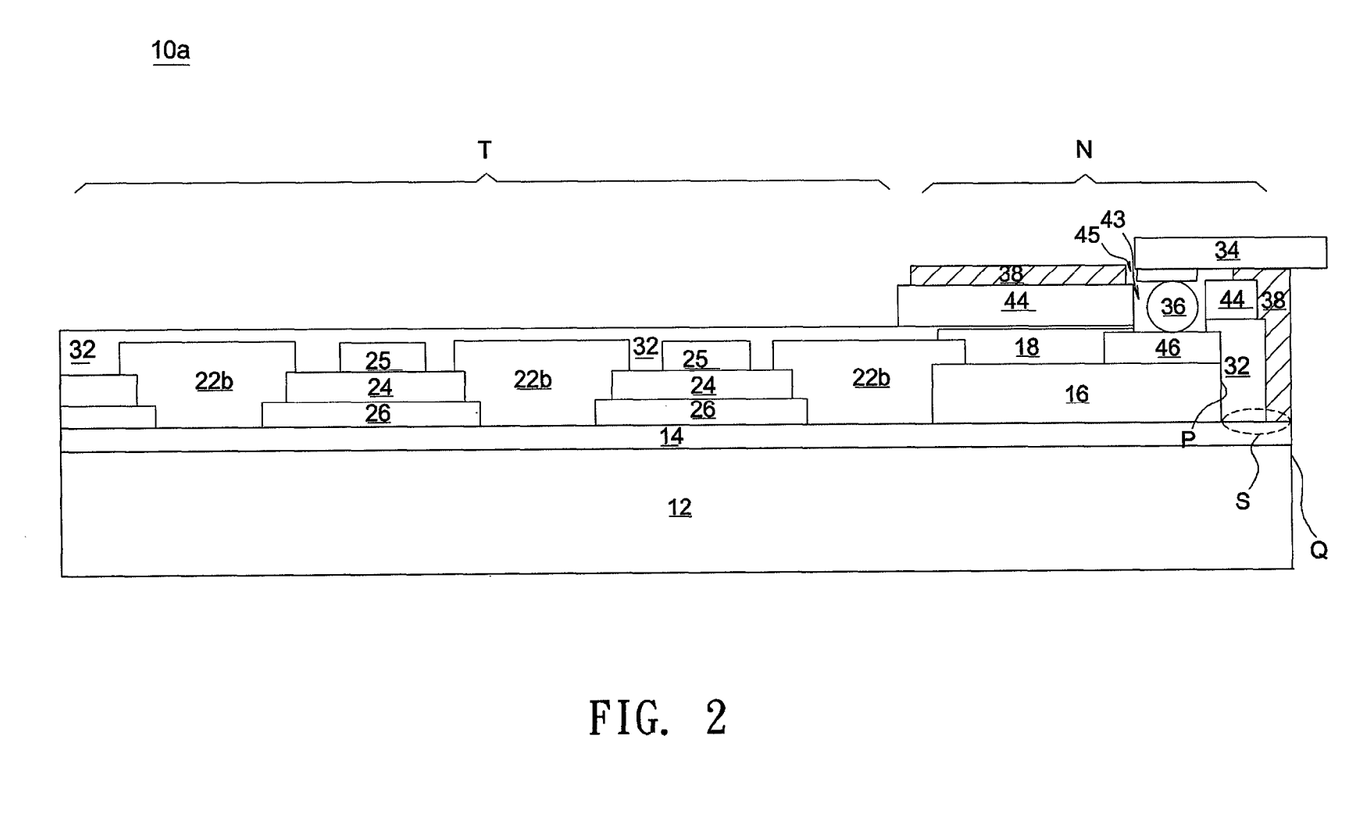
FIG. 2 shows an enlarged cross-section of FIG. 1.

FIG. 1 shows a plan view of a touch-sensitive device according to an embodiment of the invention, and FIG. 2 shows an enlarged cross-section of FIG. 1. As shown in FIG. 1 and FIG. 2, a touch-sensitive device 10a includes a transparent substrate 12 and a laminated structure formed on the transparent substrate 12. The touch-sensitive device 10a is divided into a touch-sensitive region T and a non-touch-sensitive region N. In this embodiment, the non-touch-sensitive region N is located on the periphery of the touch-sensitive device 10a and, surrounds the touch-sensitive region T. A touch-sensing structure is formed in the touch-sensitive region T of the touch-sensitive device 10a to detect touch operations. The laminated structure in the non-touch-sensitive region N may include an insulation layer 14, a decorative layer 16 and a trace layer 18. The decorative layer 16 is disposed on one side of the transparent substrate 12, and a gap region S exists between an outer edge P of the decorative layer 16 and a side edge Q of the transparent substrate 12. The trace layer 18 is disposed on the decorative layer and may include a plurality of metal traces. The touch-sensing structure in the touch-sensitive region T is electrically connected to the metal traces. Further, an insulation layer 14 may be formed on and cover the transparent substrate 12. That is, the insulation layer 14 may be disposed between the transparent substrate 12 and the decorative layer 16 and the touch-sensing structure. The material of the transparent substrate 12 includes, but not limited to, glass or plastic. Further, the transparent substrate 12 may function as a cover lens. The decorative layer 16 is formed on the periphery of the transparent substrate 12 to shield metal traces. The material of the decorative layer 16 includes at least one of photo resist, diamond-like carbon, ceramic, colored ink and resin. The touch-sensing structure in the touch-sensitive region T may be a single-layer electrode structure or a multi-layer electrode structure. In one embodiment, the touch-sensing structure may include a plurality of first sensing series 11 and a plurality of second sensing series 13 spaced apart from the first sensing series 11. For example, as shown in both FIG. 1 and FIG. 2, the touch-sensing structure has an underground-island electrode structure, where each first sensing series 11 includes multiple first transparent electrodes 22a connected with each other by multiple first connecting lines 25, each second sensing series 13 includes multiple second transparent electrodes 22b connected with each other by multiple second connecting lines 26, and a dielectric layer 24 is disposed between a first connecting line 25 and a corresponding second connecting line 26. Note the touch-sensing structure is not limited to an underground-island electrode structure. In an alternate embodiment, the connecting lines are connected with each other in the upper portion of the touch-sensing structure to form a bridge-island electrode structure. Further, the touch-sensing structure may be disposed on two opposite sides of the transparent substrate 12, and the transparent electrodes 22a and 22b may have a regular shape such as a diamond, a triangle or a line segment or may have an irregular shape.

Figure 3:
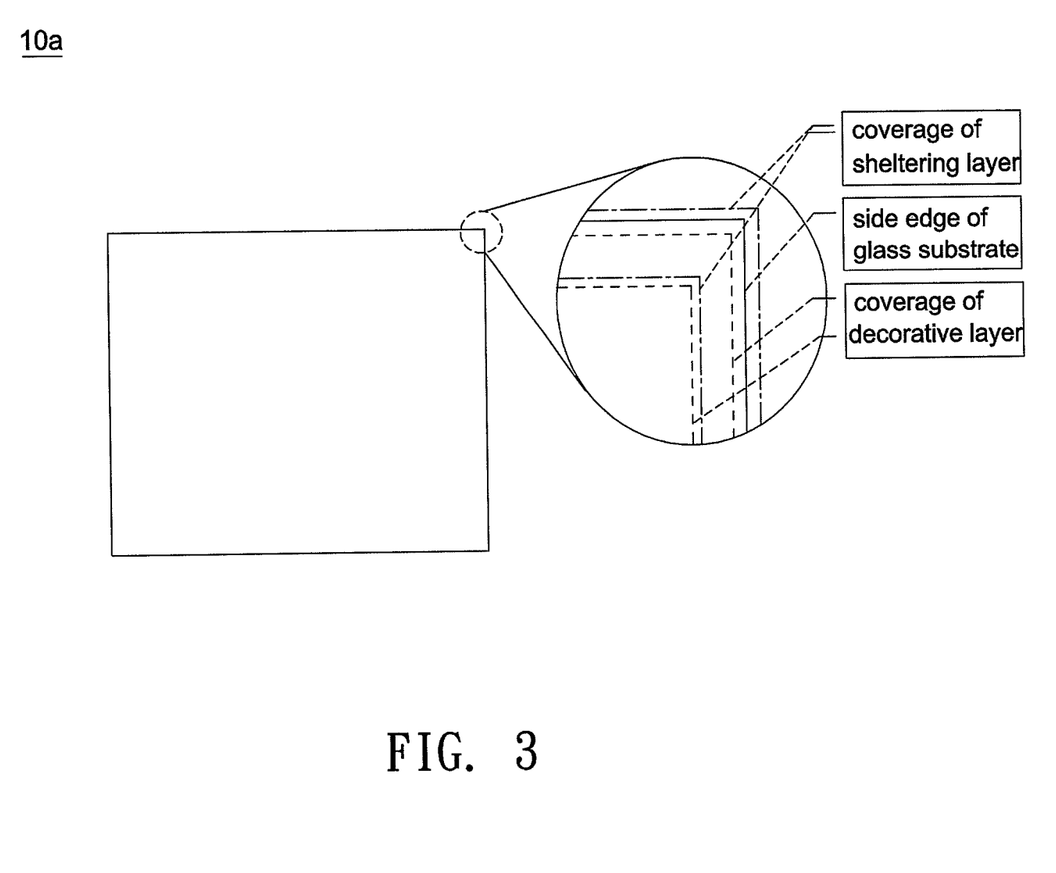
FIG. 3 shows a schematic diagram illustrating overlapping positions between a sheltering layer and a decorative layer according to an embodiment of the invention.

In this embodiment, a passivation layer 32 covers both a touch-sensing structure in the touch-sensitive region T and a laminated structure in the non-touch-sensitive region N to protect the entire touch-sensitive device 10a. The passivation layer 32 may be made from an inorganic material such as silicide. Another insulation layer 44 is formed on the passivation layer 32 and distributed only in the non-touch-sensitive region N, and the thickness of the insulation layer 44 is 3-100 times greater than the thickness of the passivation layer 32. The insulation layer 44 may be made from an inorganic material or an organic material. A transparent conductive layer 46 is formed on the decorative layer 16 and electrically connected to the metal traces in the trace layer 18. The transparent conductive layer 46 may be made from an ITO transparent conductive film. The passivation layer 32 and the insulation layer 44 both have an opening 43 formed at a position overlapping a bonding area of the transparent conductive layer 46 to expose a part of the transparent conductive layer 46. The exposed part of the transparent conductive layer 46 is electrically connected to an external circuit through an anisotropic conductive film (ACF) 36, and the external circuit may be a transmission device (such as a flexible printed circuit board 34) or an electronic device (such as an IC chip). A sheltering layer 38 may be disposed on the periphery of the non-touch-sensitive region N. The sheltering layer 38 at least overlaps the gap region S and touches the passivation layer 32 and the insulation layer 44. Also, an opening 45 is formed on the sheltering layer 38 at a position overlapping the bonding area of the transparent conductive layer 46. In this embodiment, the sheltering layer 38 may be made from ink. Typically, a cover glass is designed to have various shapes formed by special-shaped edging processing. However, the special-shaped edging processing required destruction operations that may shake and damage the decorative layer 16. Therefore, the decorative layer 16 is often kept a safe distance away from the side edge Q of the transparent 12. However, when the decorative layer 16 is disposed to be kept a safe distance away from the side edge Q, the gap region S is formed to result in periphery light leakage. As shown in FIG. 2 and FIG. 3, since the sheltering layer 38 overlaps the gap region S between an outer edge P of the decorative layer 16 and a side edge Q of the transparent substrate 12, the problem of periphery light leakage is avoided. Besides, the sheltering layer 38 is disposed on the periphery of the touch-sensitive device 10a to surround the decorative layer 16 on the trace layer 18 to provide periphery protection of the wiring structure on the cover glass and to avoid side scrapes on the decorative layer 16 to improve production reliability. Certainly, the material of the sheltering layer 38 is not restricted to ink. The sheltering layer 38 may include a translucent material, an opaque material, a material having low light transmittance, or a material capable of transmitting infrared light to reduce periphery light leakage. For example, the sheltering layer 38 may be made from at least one of photo resist, diamond-like carbon, ceramic, colored ink and resin. Further, the spread of the sheltering layer 38 is not limited to overlap the gap region S, as long as the sheltering layer 38 is disposed on the periphery of the touch-sensitive device 10a to surround the decorative layer 16 to improve production reliability.

Figure 4:
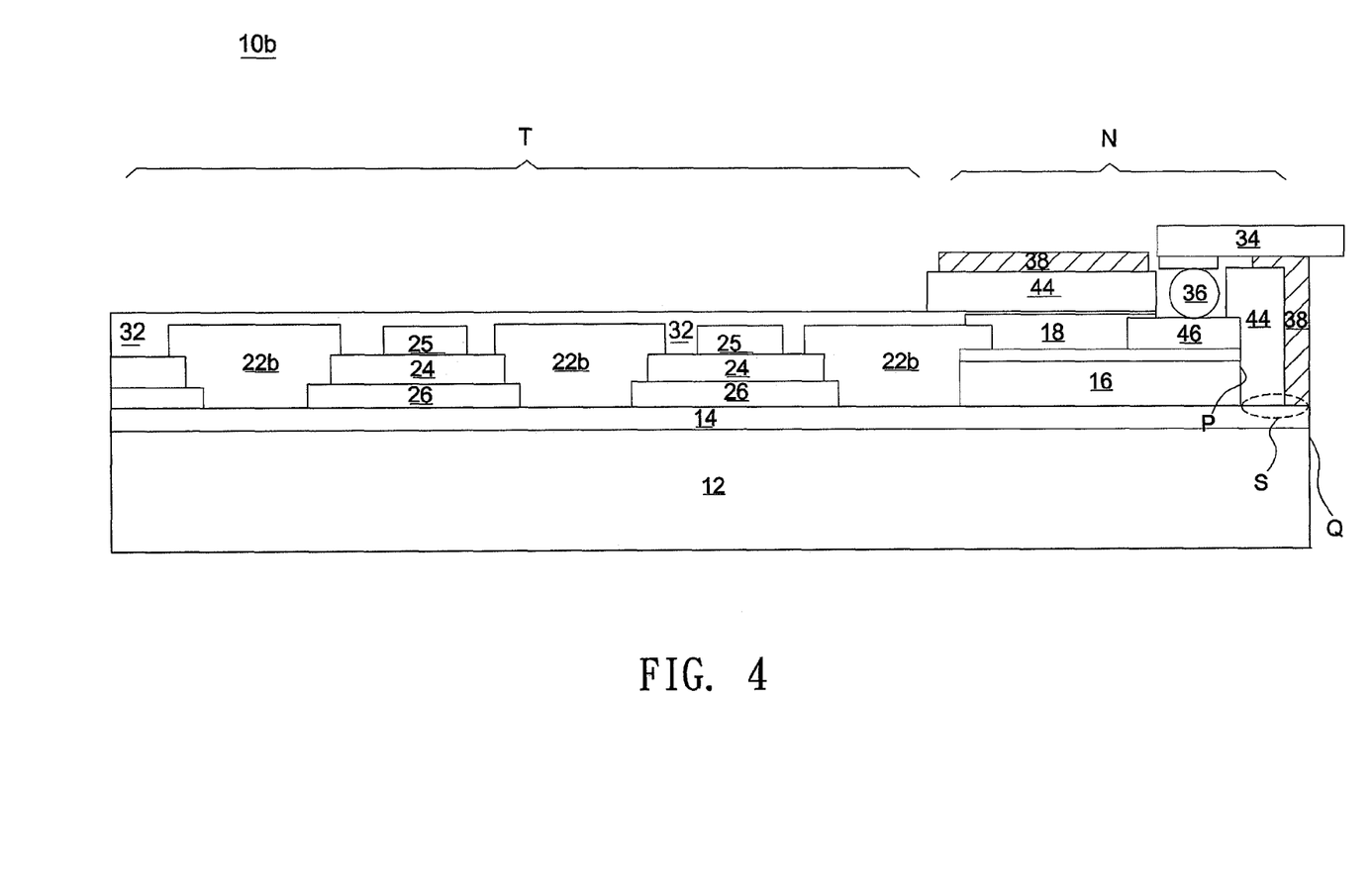
FIG. 4 shows a cross-sectional schematic diagram of a touch-sensitive device according to another embodiment of the invention.

FIG. 4 shows a touch-sensitive device according to another embodiment of the invention. Referring to the touch-sensitive device 10b shown in FIG. 4, a part of the passivation layer 32 overlapping the gap region S is omitted compared with the passivation layer 32 shown in FIG. 2. That is, the insulation layer 44 may extend downwardly to omit the part of the passivation layer 32, and the sheltering layer 38 touches the insulation layer 44 only.

Figure 5:
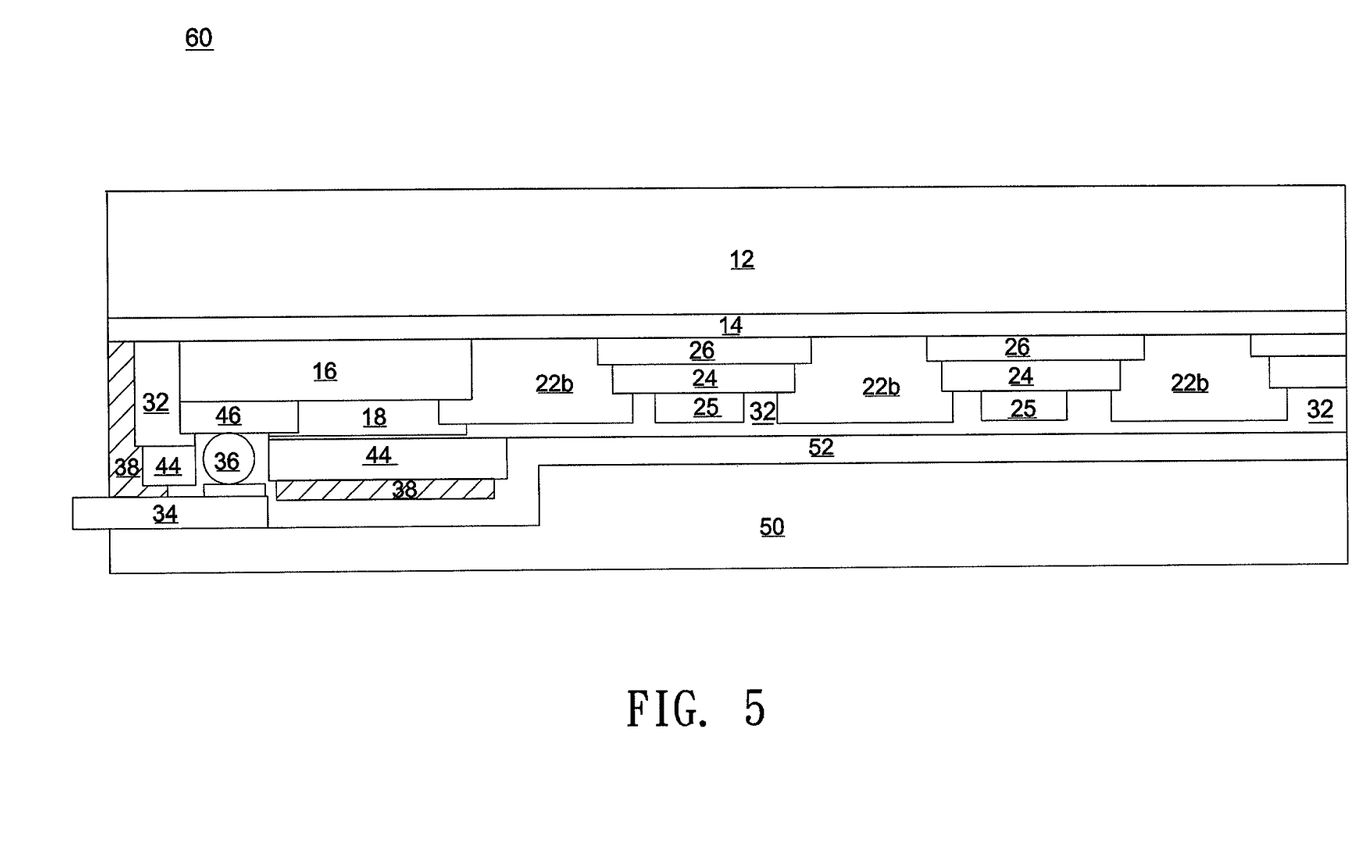
FIG. 5 shows a cross-sectional schematic diagram of a touch-sensitive display device according to an embodiment of the invention.

Note the configuration of a touch-sensing structure in the touch-sensitive region is not restricted, as long as the effect of detecting touch operations is achieved. For example, the touch-sensing structure may be an underground electrode structure, a bridge electrode structure or other electrode structure. Further, the touch-sensitive device according to the above embodiments may combine with a display device to form a touch-sensitive display device. For example, as shown in FIG. 5, a display device 50 may be attached to a touch-sensitive device 10a through an optical adhesive 52 to form a touch-sensitive display device 60. The type of the display device 50 includes, but not limited, a liquid crystal display, an organic light-emitting diode display, an electro-wetting display, a bi-stable display, and an electrophoretic display.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the present disclosure is intended to be dedicated to the public regardless of whether the element or component is explicitly recited in the following claims.

What is claimed is:

1. A touch-sensitive device, comprising:
    a transparent substrate;
    a touch-sensing structure disposed on the transparent substrate;
    a decorative layer disposed on the transparent substrate, wherein a gap region is formed between an outer edge of the decorative layer and a side edge of the transparent substrate;
    a trace layer disposed on the decorative layer and electrically connected to the touch-sensing structure;
    a passivation layer disposed on the transparent substrate and covering at least a part of the touch-sensing structure and at least a part of the trace layer; and
    a light-shielding sheltering layer disposed on the transparent substrate and overlapping the gap region between the outer edge of the decorative layer and the side edge of the transparent substrate, with the light-shielding sheltering layer covering at least a part of the decorative layer and at least a part of the passivation layer.

2. The touch-sensitive device as claimed in claim 1, wherein the light-shielding sheltering layer is disposed on at least a part of a periphery of the transparent substrate.

3. The touch-sensitive device as claimed in claim 1, wherein the touch-sensing structure comprises a plurality of first sensing series and a plurality of second sensing series spaced apart from the first sensing series, and at least a part of the second sensing series covers at least a part of the decorative layer.

4. The touch-sensitive device as claimed in claim 1, wherein the light-shielding sheltering layer comprises at least one of photo resist, diamond-like carbon, ceramic, colored ink and resin.

5. The touch-sensitive device as claimed in claim 1, wherein the light-shielding sheltering layer comprises at least one of a translucent material, an opaque material, and a material having low light transmittance.

6. The touch-sensitive device as claimed in claim 1, wherein the decorative layer comprises at least one of photo resist, diamond-like carbon, ceramic, colored ink and resin.

7. The touch-sensitive device of claim 1, wherein the light-shielding sheltering layer surrounds the decorative layer.

8. The touch-sensitive device as claimed in claim 1, further comprising:
    an insulation layer formed on the transparent substrate, wherein the touch-sensing structure and the decorative layer are formed on the insulation layer.

9. The touch-sensitive device as claimed in claim 1, wherein the transparent substrate is a cover lens.

10. The touch-sensitive device as claimed in claim 1, further comprising:
    a transparent conductive layer disposed on the decorative layer and electrically connected to the trace layer and an external circuit.

11. The touch-sensitive device as claimed in claim 1, further comprising:
    an insulation layer disposed on the transparent substrate and overlapping the gap region.

12. The touch-sensitive device as claimed in claim 1, further comprising:

a transparent conductive layer disposed on the decorative layer, wherein the passivation layer has an opening on the transparent conductive layer to expose a part of the transparent conductive layer, and the transparent conductive layer is electrically connected to the trace layer and an external circuit.

13. The touch-sensitive device as claimed in claim 1, wherein the transparent substrate is a glass substrate or a plastic substrate.

14. The touch-sensitive device as claimed in claim 1, wherein the touch-sensing structure comprises:
a plurality of first sensing series, wherein each of the first sensing series comprises multiple first electrodes and multiple first connecting lines, and the multiple first electrodes are connected with each other by the multiple first connecting lines;
a plurality of second sensing series spaced apart from the first sensing series, wherein each of the second sensing series comprises multiple second electrodes and multiple second connecting lines, and the multiple second electrodes are connected with each other by the multiple second connecting lines; and
a dielectric layer disposed between the multiple first connecting lines and the multiple second connecting lines, wherein the dielectric layer includes multiple segments isolated from each other, and at least one of the second electrodes covers a part of one of the multiple segments.

15. The touch-sensitive device as claimed in claim 14, wherein the decorative layer is formed from photo resist and the light-shielding sheltering layer is formed from ink.

16. The touch-sensitive device as claimed in claim 1, wherein the light-shielding sheltering layer touches the passivation layer in the gap region.

17. The touch-sensitive device as claimed in claim 16, wherein the light-shielding sheltering layer comprises a material capable of transmitting infrared light.

18. The touch-sensitive device as claimed in claim 1, wherein an outer edge of the light-shielding sheltering layer forms at least one angle with the transparent substrate.

19. The touch-sensitive device as claimed in claim 1, wherein the light-shielding sheltering layer comprises a material capable of transmitting infrared light.

20. The touch-sensitive device as claimed in claim 1, wherein the passivation layer has at least an opening to expose at least a part of the trace layer.

21. The touch-sensitive device as claimed in claim 1, wherein the decorative layer is formed from photo resist and the light-shielding sheltering layer is formed from ink.

22. The touch-sensitive device as claimed in claim 21, wherein the light-shielding sheltering layer comprises a material capable of transmitting infrared light.

23. The touch-sensitive device as claimed in claim 1, wherein each of the decorative layer and the light-shielding sheltering layer is a colored layer.

24. The touch-sensitive device as claimed in claim 1, wherein the light-shielding sheltering layer covers the side edge of the transparent substrate, and a distance between an outer edge of the light-shielding sheltering layer and the outer edge of the decorative layer is larger than a distance between the side edge of the transparent substrate and the outer edge of the decorative layer.

25. A touch-sensitive device, comprising:
a transparent substrate;
an electrode structure disposed on the transparent substrate;
a decorative layer disposed on the transparent substrate, wherein the electrode structure covers a part of the decorative layer, and a gap region is formed between an outer edge of the decorative layer and a side edge of the transparent substrate;
a passivation layer disposed on the transparent substrate and covering at least a part of the touch-sensing structure; and
a light-shielding sheltering layer disposed on the transparent substrate and overlapping the gap region, with the light-shielding sheltering layer covering at least a part of the decorative layer and at least a part of the passivation layer.

26. The touch-sensitive device as claimed in claim 25, wherein the electrode structure is a single-layer electrode structure.

27. The touch-sensitive device as claimed in claim 25, wherein the single-layer electrode structure comprises a plurality of electrodes, and each of the electrodes is in the shape of a triangle.

28. The touch-sensitive device as claimed in claim 25, wherein the light-shielding sheltering layer is disposed on at least a part of a periphery of the transparent substrate.

29. The touch-sensitive device as claimed in claim 25, further comprising a trace layer disposed on the decorative layer and electrically connected to the electrode structure.

30. The touch-sensitive device as claimed in claim 25, wherein the electrode structure comprises a plurality of first sensing series and a plurality of second sensing series spaced apart from the first sensing series, and at least a part of the second sensing series covers a part of the decorative layer.

31. The touch-sensitive device as claimed in claim 30, wherein the light-shielding sheltering layer comprises a material capable of transmitting infrared light.

32. The touch-sensitive device as claimed in claim 25, wherein the light-shielding sheltering layer surrounds the decorative layer.

33. The touch-sensitive device as claimed in claim 32, wherein each of the decorative layer and the light-shielding sheltering layer is a colored layer.

34. The touch-sensitive device as claimed in claim 25, further comprising:
an insulation layer formed on the transparent substrate, wherein the electrode structure and the decorative layer are formed on the insulation layer.

35. The touch-sensitive device as claimed in claim 25, wherein the transparent substrate is a cover lens.

36. The touch-sensitive device as claimed in claim 25, wherein the electrode structure comprises:
a plurality of first sensing series, wherein each of the first sensing series comprises multiple first electrodes and multiple first connecting lines, and the multiple first electrodes are connected with each other by the multiple first connecting lines;
a plurality of second sensing series spaced apart from the first sensing series, wherein each of the second sensing series comprises multiple second electrodes and multiple second connecting lines, and the multiple second electrodes are connected with each other by the multiple second connecting lines; and
a dielectric layer disposed between the multiple first connecting lines and the multiple second connecting lines, wherein the dielectric layer includes multiple segments isolated from each other, and at least one of the multiple second electrodes covers a part of one of the multiple segments.

37. The touch-sensitive device as claimed in claim 25, wherein the light-shielding sheltering layer touches the passivation layer in the gap region.

38. The touch-sensitive device as claimed in claim 25, wherein the decorative layer is formed from photo resist and the light-shielding sheltering layer is formed from ink.

39. A touch-sensitive display device, comprising:
 a touch-sensitive device, comprising:
  a transparent substrate;
  a touch-sensing structure disposed on the transparent substrate;
  a decorative layer disposed on the transparent substrate, wherein a gap region is formed between an outer edge of the decorative layer and a side edge of the transparent substrate;
  a trace layer disposed on the decorative layer and electrically connected to the touch-sensing structure;
  a passivation layer disposed on the transparent substrate and covering at least a part of the touch-sensing structure and at least a part of the trace layer; and
  a light-shielding sheltering layer disposed on the transparent substrate and overlapping the gap region between the outer edge of the decorative layer and the side edge of the transparent substrate, with the light-shielding sheltering layer covering at least a part of the decorative layer and at least a part of the passivation layer; and
 a display device attached to the touch-sensitive device and overlapping at least a part of the decorative layer.

40. The touch-sensitive display device as claimed in claim 39, wherein the display device is a liquid crystal display, an organic light-emitting diode display, an electro-wetting display, a bi-stable display, or an electrophoretic display.

41. The touch-sensitive display device as claimed in claim 39, wherein the display device is attached to the touch-sensitive device through an optical adhesive.

42. The touch-sensitive display device as claimed in claim 41, wherein the decorative layer is formed from photo resist and the light-shielding sheltering layer is formed from ink.

43. The touch-sensitive display device as claimed in claim 39, wherein the light-shielding sheltering layer is disposed on at least a part of the periphery of the transparent substrate and surrounds at least a part of the decorative layer.

44. The touch-sensitive display device as claimed in claim 43, wherein the light-shielding sheltering layer comprises a material capable of transmitting infrared light.

45. The touch-sensitive display device as claimed in claim 39, wherein the touch-sensing structure comprises:
 a plurality of first sensing series, wherein each of the first sensing series comprises multiple first electrodes and multiple first connecting lines, and the multiple first electrodes are connected with each other by the multiple first connecting lines;
 a plurality of second sensing series spaced apart from the first sensing series, wherein each of second sensing series comprises multiple second electrodes and multiple second connecting lines, and the multiple second electrodes are connected with each other by the multiple second connecting lines; and
 a dielectric layer disposed between the multiple first connecting lines and the multiple second connecting lines, wherein the dielectric layer includes multiple segments isolated from each other, and at least one of the multiple second electrodes covers a part of one of the multiple segments.

46. The touch-sensitive display device as claimed in claim 45, wherein the light-shielding sheltering layer comprises a material capable of transmitting infrared light.

47. The touch-sensitive display device as claimed in claim 45, wherein the decorative layer is formed from photo resist and the light-shielding sheltering layer is formed from ink.

48. The touch-Sensitive display device as claimed in claim 45, wherein each of the decorative layer and the light-shielding sheltering layer is a colored layer.

* * * * *

UNITED STATES PATENT AND TRADEMARK OFFICE
CERTIFICATE OF CORRECTION

| | | |
|---|---|---|
| PATENT NO. | : 8,643,614 B2 | Page 1 of 1 |
| APPLICATION NO. | : 13/152805 | |
| DATED | : February 4, 2014 | |
| INVENTOR(S) | : Ming-Kung Wu | |

It is certified that error appears in the above-identified patent and that said Letters Patent is hereby corrected as shown below:

In the Claims

At column 8, claim number 25, line number 5, delete "touch-sensing" and insert -- electrode --.

Signed and Sealed this
Eighteenth Day of November, 2014

Michelle K. Lee
*Deputy Director of the United States Patent and Trademark Office*